United States Patent
Lee

(10) Patent No.: US 7,715,270 B2
(45) Date of Patent: May 11, 2010

(54) ADDRESS SYNCHRONOUS CIRCUIT CAPABLE OF REDUCING CURRENT CONSUMPTION IN DRAM

(75) Inventor: Sang Kwon Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 198 days.

(21) Appl. No.: 12/005,707

(22) Filed: Dec. 28, 2007

(65) Prior Publication Data

US 2009/0003122 A1 Jan. 1, 2009

(30) Foreign Application Priority Data

Jun. 27, 2007 (KR) .............. 10-2007-0063930

(51) Int. Cl.
*G11C 8/00* (2006.01)
(52) U.S. Cl. .............. 365/230.08; 365/233.1; 365/233.11
(58) Field of Classification Search ............ 365/230.08, 365/233.1, 233.11, 233.12, 191, 194
See application file for complete search history.

(56) References Cited

U.S. PATENT DOCUMENTS

| 5,586,081 | A | 12/1996 | Mills et al. |
| 5,625,302 | A | 4/1997 | Covino et al. |
| 6,064,627 | A * | 5/2000 | Sakurai .................... 365/233.1 |
| 6,356,508 | B1 * | 3/2002 | Yoshimoto ............... 365/233.1 |
| 6,480,033 | B1 * | 11/2002 | Shinozaki ................... 326/105 |
| 6,570,812 | B2 * | 5/2003 | Kono .................... 365/230.08 |
| 6,636,110 | B1 * | 10/2003 | Ooishi et al. ................. 327/565 |
| 6,982,923 | B2 * | 1/2006 | Ootsuki .................. 365/189.15 |
| 2002/0047742 | A1 * | 4/2002 | Setogawa .................... 327/544 |

FOREIGN PATENT DOCUMENTS

| KR | 10-0356638 | 10/2002 |
| KR | 10-0583834 B1 | 5/2006 |
| KR | 10-2007-0062866 A | 6/2007 |

* cited by examiner

*Primary Examiner*—Richard Elms
*Assistant Examiner*—Hien N Nguyen
(74) *Attorney, Agent, or Firm*—John P. White; Cooper & Dunham LLP

(57) ABSTRACT

An address synchronous circuit includes an address control signal generating unit for generating a control signal in response to operation mode signals of a semiconductor memory and an internal clock signal, and an address synchronous unit for controlling output of an address which is buffered in accordance with a clock enable signal, in response to the control signal.

15 Claims, 5 Drawing Sheets

ADDRESS SYNCHRONOUS CIRCUIT CAPABLE OF REDUCING CURRENT CONSUMPTION IN DRAM

BACKGROUND

The present disclosure relates to a semiconductor device and, more particularly, to an address synchronous circuit.

A semiconductor memory device, including a DRAM, has a memory cell array with a plurality of memory cells for storing data and a peripheral circuit for controlling data input/output operations.

The memory cell array forms a matrix which has a plurality of rows and columns, namely, word lines and bit lines. A predetermined address is assigned to each row and column. A row address is used to designate a specific row, and a column address is used to designate a specific column.

Meanwhile, a clock is used as a reference for adjusting operation timing in a system or a circuit. The clock is also used for guaranteeing a faster operation without an error. Examples of such a clock synchronous semiconductor memory device are a SDRAM (Synchronous DRAM) or a DDR SDRAM (Double Data Rate Synchronous DRAM).

FIG. 1 is a block diagram of a conventional address synchronous circuit, and FIG. 2 is a detailed circuit diagram of the address synchronous circuit of FIG. 1.

As shown in FIG. 1, the conventional address synchronous circuit includes an address input buffer unit 100, a setup hold delay unit 200 and an address synchronous unit 300.

As shown in FIG. 2, the address synchronous unit 300 includes a cross-coupled latch unit 301 for synchronizing an address ADD_OUT which is output from the setup hold delay unit 200 with an internal clock signal CLKP4 and a driving unit 302 for pull-up or pull-down driving in response to an output signal of the cross-coupled latch unit 301.

According to the conventional address synchronous circuit, an address ADD is input to the address input buffer unit 100 and then is input to the address synchronous unit 300 via the setup hold delay unit 200. The inputted address is synchronized with the internal clock signal CLKP4 through the cross-coupled latch unit 301.

However, the conventional address synchronous circuit continuously consumes a current because it outputs the address in synchronization with the internal clock signal CLKP4 whenever the address changes. Such an unnecessary current consumption causes an increase in the current consumption in the memory, especially in the DRAM.

SUMMARY

According to an aspect of the present disclosure, an address synchronous circuit comprises an address control signal generating unit for generating a control signal in response to operation mode signals of a semiconductor memory and an internal clock signal, and an address synchronous unit for controlling output of an address which is buffered in accordance with a clock enable signal, in response to the control signal. The address synchronous circuit further comprises a setup hold delay unit for delaying the address which is buffered in accordance with the clock enable signal and outputting the address. The operation mode signals of the semiconductor memory include a chip select signal, a RAS signal, a CAS signal and a write enable signal. The chip select signal, the RAS signal, the CAS signal and the write enable signal are output from the setup hold delay unit via an address input buffer unit. The address control signal generating unit outputs the control signal of a low level when the chip select signal is inactivated or when the RAS signal, the CAS signal and the write enable signal are all inactivated. The address control signal generating unit outputs the control signal in synchronization with the internal clock signal when the chip select signal, the RAS signal, the CAS signal and the write enable signal are all activated. The address control signal generating unit includes a first logic unit for performing a first logic operation in response to the operation mode signals of the semiconductor memory, a latch unit for latching an output signal of the first logic unit in response to the internal clock signal, and a second logic unit for performing a second logic operation in response to the output signal of the latch unit and the internal clock signal. The address synchronous unit includes a cross-coupled latch unit for latching an address which is input in response to the control signal, and a driving unit for pull-up or pull-down driving in response to an output signal of the cross-coupled latch unit.

According to another aspect of the present disclosure, an address synchronous circuit comprises an address input buffer unit for outputting an address signal in response to a clock enable signal, a setup hold delay unit for delaying an output signal of the address input buffer unit and outputting the signal, an address control signal generating unit for generating a control signal in response to operation mode signals of a semiconductor memory and an internal clock signal, and an address synchronous unit for controlling an output of an address which is output from the setup hold delay unit in response to the control signal. The operation mode signals of the semiconductor memory include a chip select signal, a RAS signal, a CAS signal and a write enable signal. The chip select signal, the RAS signal, the CAS signal and the write enable signal are output from the setup hold delay unit via the address input buffer unit. The address control signal generating unit outputs the control signal of a low level when the chip select signal is inactivated or when the RAS signal, the CAS signal and the write enable signal are all inactivated. The address control signal generating unit outputs the control signal in synchronization with the internal clock signal when the chip select signal, the RAS signal, the CAS signal and the write enable signal are all activated. The address control signal generating unit includes a first logic unit for performing a first logic operation in response to the operation mode signals of the semiconductor memory, a latch unit for latching an output signal of the first logic unit in response to the internal clock signal, and a second logic unit for performing a second logic operation in response to the output signal of the latch unit and the internal clock signal. The address synchronous unit includes a cross-coupled latch unit for latching an address which is input in response to the control signal, and a driving unit for pull-up or pull-down driving in response to an output signal of the cross-coupled latch unit.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION OF EXEMPLARY EMBODIMENTS

Hereinafter, examples and exemplary embodiments of the present invention will be described. While the examples and exemplary embodiments are provided to exemplify the present invention, the scope of the present invention to be protected is not limited by the examples and exemplary embodiments.

Figure 1:
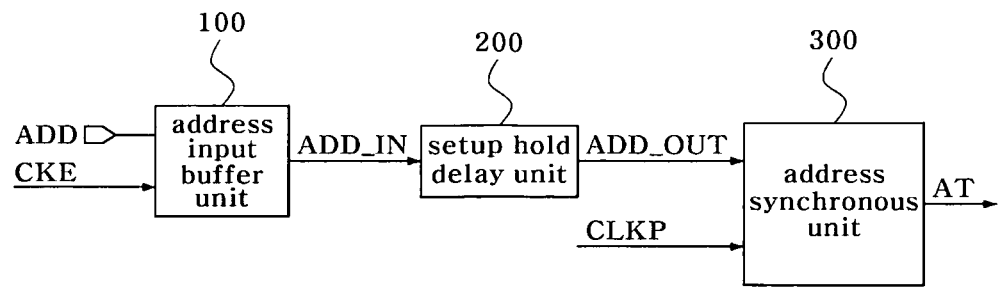
FIG. 1 is a block diagram of a conventional address synchronous circuit.
Figure 2:
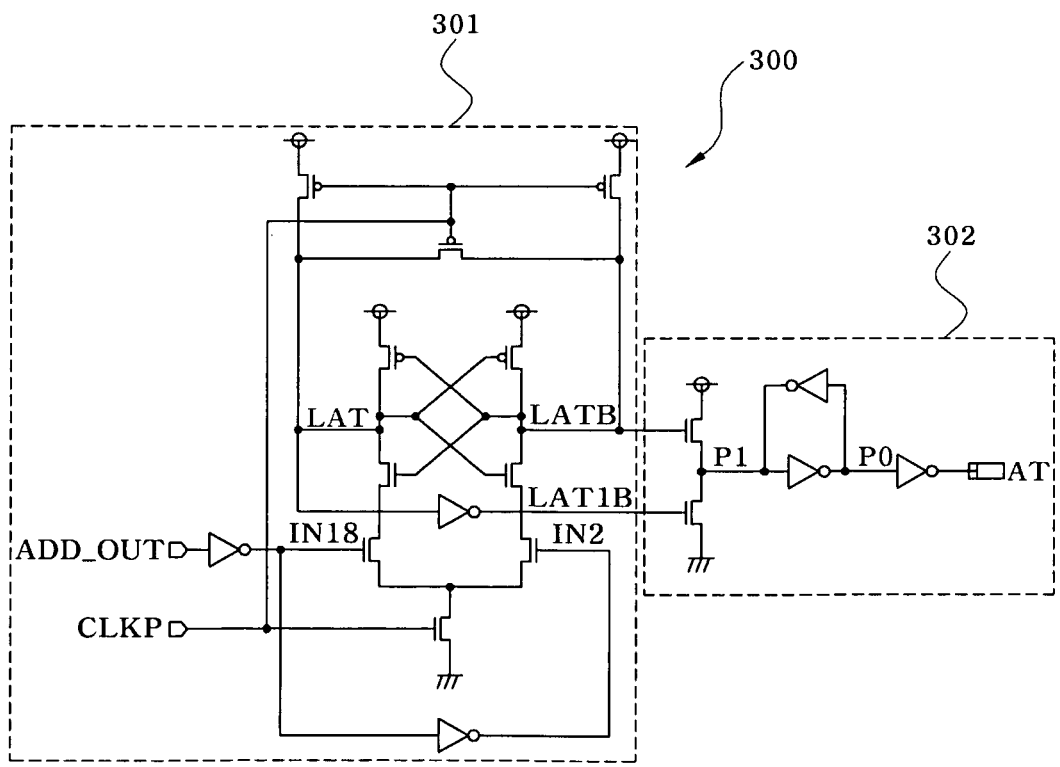
FIG. 2 is a detailed circuit diagram of an address synchronous unit shown in FIG. 1.
Figure 3:
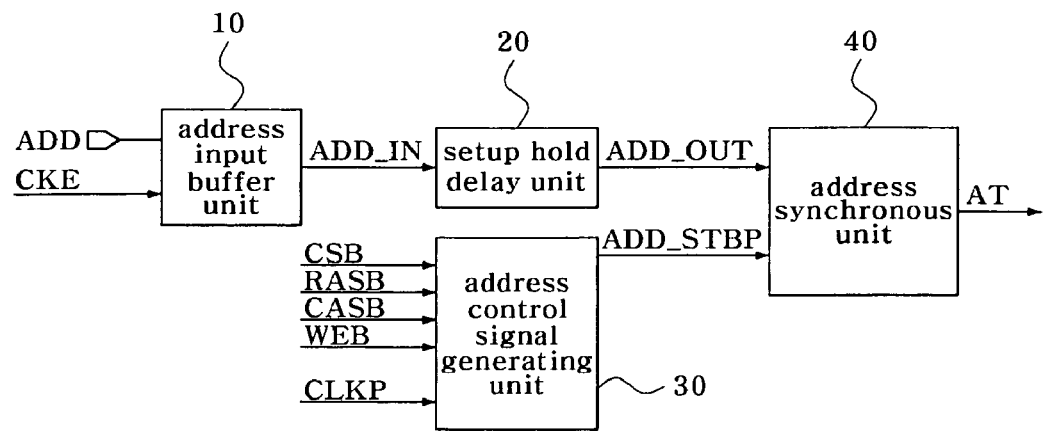
FIG. 3 is a block diagram of an address synchronous circuit according to an exemplary embodiment of the present disclosure.

As shown in FIG. 3, an address synchronous circuit according to an exemplary embodiment of the present disclosure includes an address input buffer unit 10 which outputs an address signal ADD_IN, in response to a clock enable signal CKE, a setup hold delay unit 20 which delays the output signal of the address input buffer unit 10 and then outputs it, an address control signal generating unit 30 which outputs a control signal ADD_STBP, in response to operation mode signals CSB, RASB, CASB and WEB of a semiconductor memory and an internal clock signal CLKP, and an address synchronous unit 40 which controls an output of the address ADD_OUT output from the setup hold delay unit 20 in response to the control signal ADD_STBP.

The output of the address input buffer unit 10 is controlled based on the clock enable signal CKE, and it is enabled when the clock enable signal is activated.

The setup hold delay unit 20 is a delayer for adjusting setup and hold times with a synchronization signal.

Figure 4:
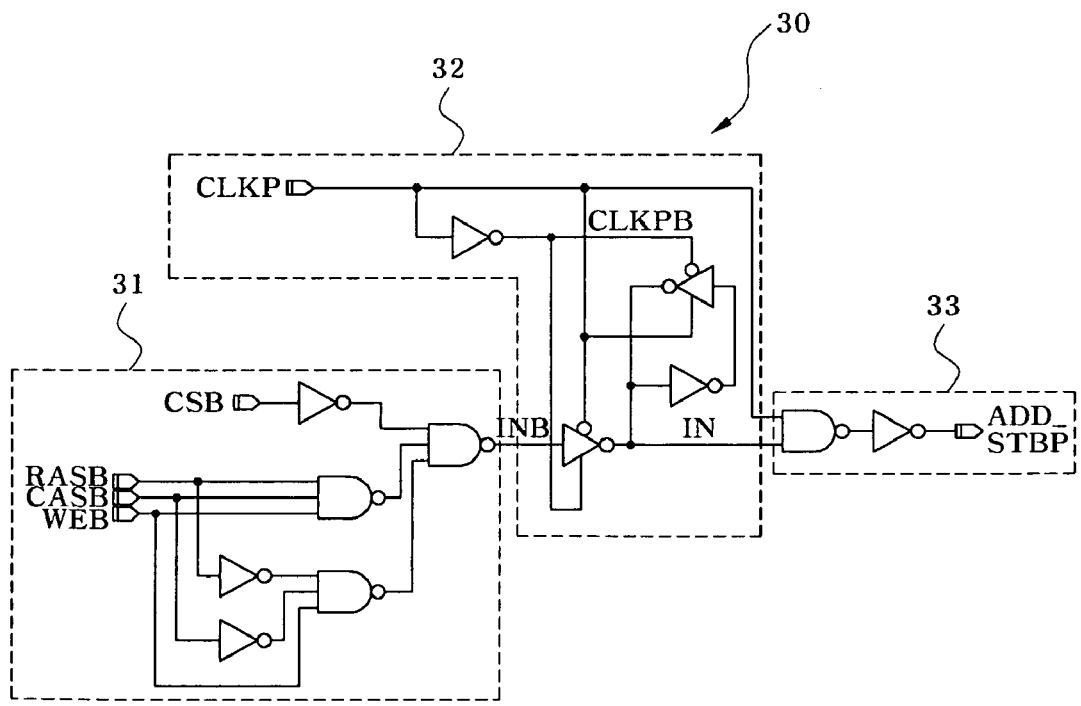
FIG. 4 is a circuit diagram of an address control signal generating unit shown in FIG. 3.

As shown in FIG. 4, the address control signal generating unit 30 includes a first logic unit 31 which performs a logic operation, in response to the operation mode signals CSB, RASB, CASB and WEB of the semiconductor memory, a latch unit 32 which latches an output signal INB of the first logic unit 31, in response to the internal clock signal CLKP, and a second logic unit 33 which performs a logic operation, in response to the output signal IN of the latch unit 32 and the internal clock signal CLKP.

Here, a chip select signal (CSB), a RAS signal (RASB), a CAS signal (CASB) and a write enable signal (WEB) are output from the setup hold delay unit 20 via the address input buffer unit 10 and they are output as the operation mode signals CSB, RASB, CASB and WEB of the semiconductor memory, respectively.

The first logic unit 31 includes a logic element which performs a NAND operation, in response to the operation mode signals CSB, RASB, CASB and WEB of the semiconductor memory. The latch unit 32 includes a latch element which latches the output signal INB of the first logic unit 31, in response to the internal clock signal CLKP.

As shown in FIG. 4, the address control signal generating unit 30 outputs the control signal ADD_STBP of a low level when the chip select signal (CSB) is inactivated or when the RAS signal (RASB), the CAS signal (CASB) and the write enable signal (WEB) are all inactivated.

The address control signal generating unit 30 outputs the control signal ADD_STBP in synchronization with the internal clock signal CLKP when the chip select signal (CSB), the RAS signal (RASB), the CAS signal (CASB) and the write enable signal (WEB) are all activated.

Figure 5:
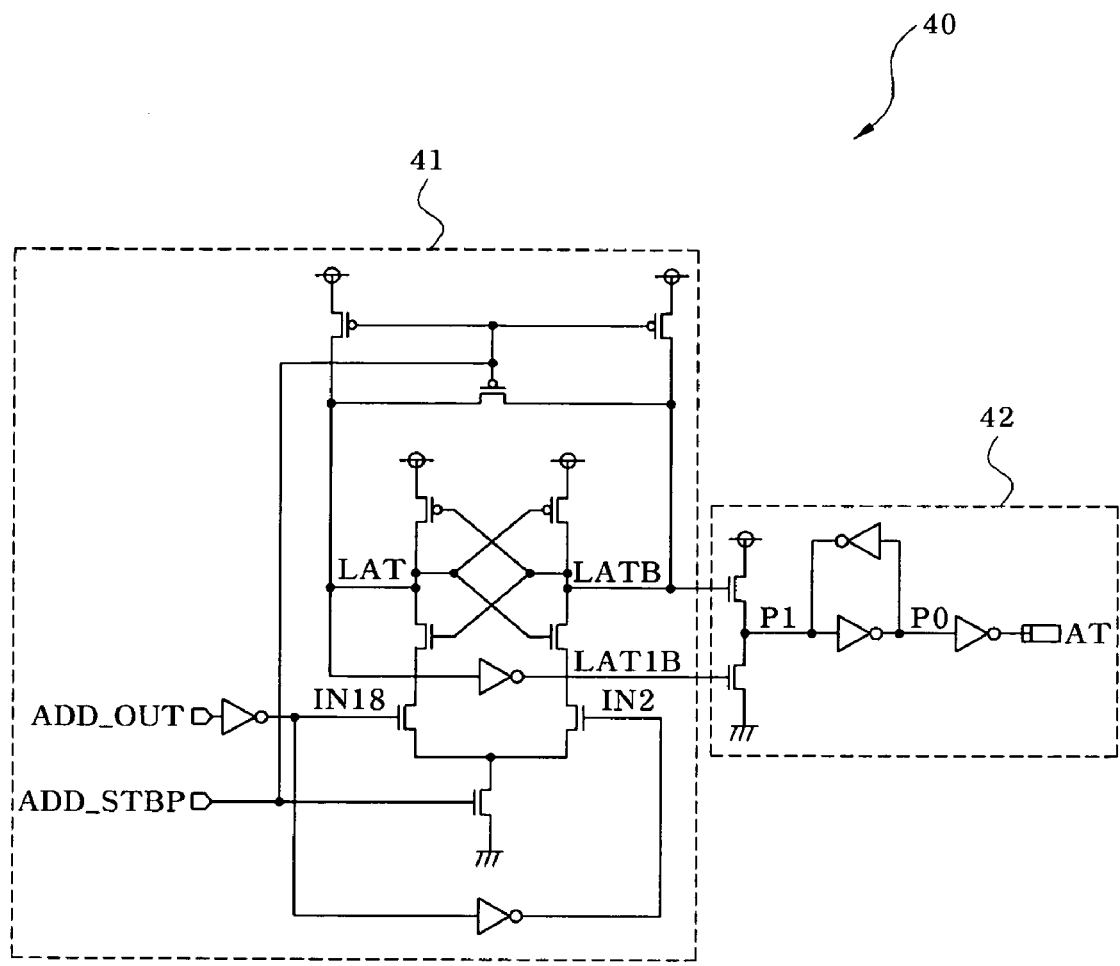
FIG. 5 is a detailed circuit diagram of the address synchronous unit of FIG. 3.

As shown in FIG. 5, the address synchronous unit 40 includes a cross-coupled latch unit 41 for latching the address ADD_OUT which is output from the setup hold delay unit 20, in response to the control signal ADD_STBP from the address control signal generating unit 30 and a driving unit 42 for pull-up or pull-down driving, in response to output signals LATB and LAT1B of the cross-coupled latch unit 41.

Figure 6A:
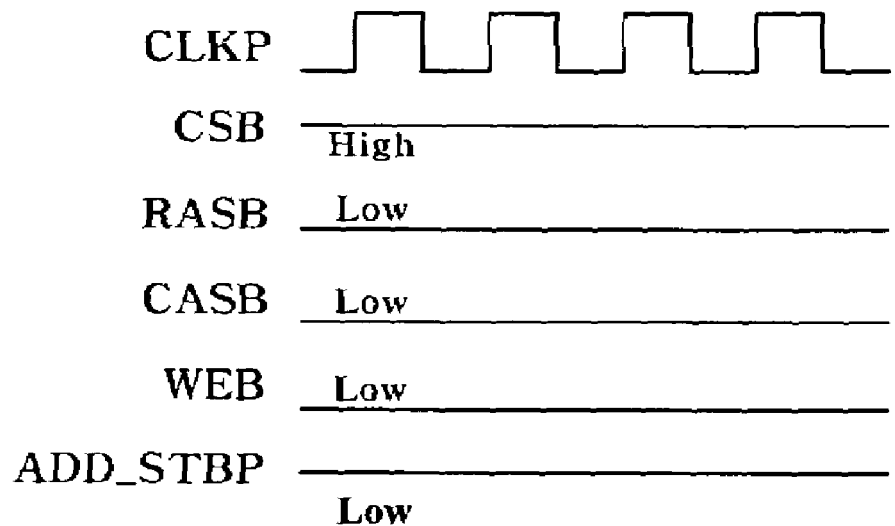
FIGS. 6a, 6b and 6c are timing charts of the address control signal generating unit of FIG. 4.
Figure 6B:
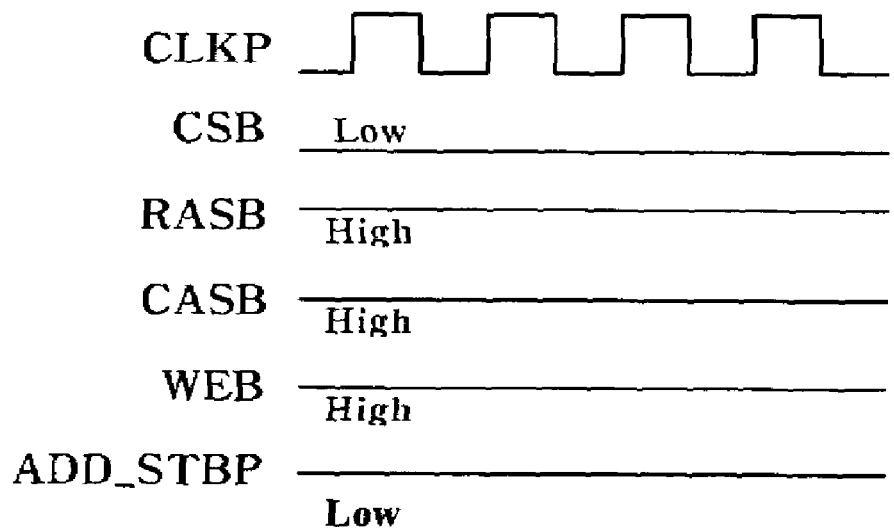
Figure 6C:
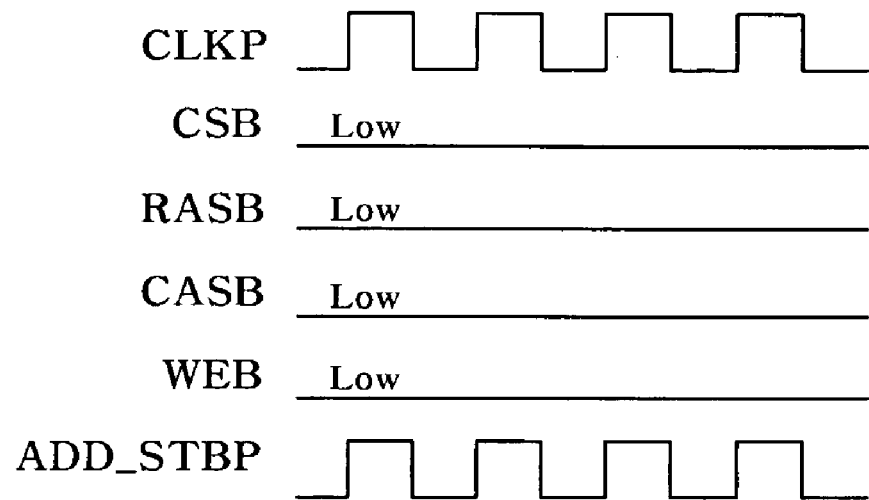

The operation of the address synchronous circuit will be described in detail referring to the drawings. FIGS. 6a, 6b and 6c are timing charts of the address control signal generating unit 30.

First, as shown in FIG. 3, the address input buffer unit 10 outputs the address signal ADD_IN, in response to the clock enable signal CKE. The address input buffer unit 10 receives the control of the clock enable signal CKE, and it is enabled when the clock enable signal is activated.

The setup hold delay unit 20 is a delayer for adjusting setup and hold times with a synchronization signal. The setup hold delay unit 20 delays the output signal of the address input buffer unit 10 and outputs it.

Then, the address control signal generating unit 30 outputs the control signal ADD_STBP, in response to the operation mode signals CSB, RASB, CASB and WEB of the semiconductor memory and the internal clock signal CLKP4.

The address synchronous unit 40 controls an output of the address ADD_OUT which is output from the setup hold delay unit 20.

The operation of the address control signal generating unit 30 is described in detail below.

As shown in FIG. 4, the address control signal generating unit 30 receives the operation mode signals CSB, RASB, CASB and WEB of the semiconductor memory and the internal clock signal CLKP as input signals.

Here, the chip select signal (CSB), the RAS signal (RASB), the CAS signal (CASB) and the write enable signal (WEB) are output from the setup hold delay unit 20 via the address input buffer unit 10 and they are output as the operation mode signals CSB, RASB, CASB and WEB of the semiconductor memory, respectively. When the chip select signal (CSB), the RAS signal (RASB), the CAS signal (CASB) and the write enable signal (WEB) are in a high level, the operation mode signals CSB, RASB, CASB and WEB of the semiconductor memory are in a high level.

Then, as shown in FIGS. 6a and 6b, the address control signal generating unit 30 outputs the control signal ADD_STBP of a low level when the chip select signal (CSB) is in a high level or when the RAS signal (RASB), the CAS signal (CASB) and the write enable signal (WEB) are all in a high level.

Also, as shown in FIG. 6c, the address control signal generating unit 30 outputs the control signal ADD_STBP in synchronization with the internal clock signal CLKP4 when the chip select signal (CSB), the RAS signal (RASB), the CAS signal (CASB) and the write enable signal (WEB) are all in a low level.

That is, the address control signal generating unit 30 outputs the control signal ADD_STBP of a low level when the chip select signal (CSB) is in a high level or when the RAS signal (RASB), the CAS signal (CASB) and the write enable signal (WEB) are all in a high level, and it outputs the control signal ADD_STBP in synchronization with the internal clock signal CLKP4 in other cases.

Then, as shown in FIG. 5, the address synchronous unit 40 latches and outputs the inputted address ADD_OUT which is enabled or disabled in response to the control signal ADD_STBP or does not output the address.

Accordingly, when the chip select signal (CSB) is in a high level or when the RAS signal (RASB), the CAS signal (CASB) and the write enable signal (WEB) are all in a high level, a current consumption does not occur any more in the address synchronous unit 40 even if the address is continuously toggled.

Although the current consumption occurs in the address control signal generating unit 30, the entire current consumption of the DRAM is reduced because the address synchronous unit 40 does not operate in synchronization with the internal clock signal CLKP4.

The present application claims priority to Korean application number 10-2007-0063930, filed on Jun. 27, 2007, the entire contents of which are incorporated herein by reference.

What is claimed is:

1. An address synchronous circuit comprising:
   an address control signal generating unit configured to generate a control signal in response to one or more operation mode signals of a semiconductor memory and an internal clock signal; and
   an address synchronous unit configured to control an output of a buffered address buffered in accordance with a clock enable signal, in response to the control signal
   wherein the address control signal generating unit generates the control signal in synchronization with the internal clock signal when the operation mode signals of the semiconductor memory are activated, and generates a disabled control signal when the operation mode signals of the semiconductor memory are inactivated.

2. The address synchronous circuit of claim 1, further comprising a setup hold delay unit for delaying the buffered address buffered in accordance with the clock enable signal and outputting the delayed address.

3. The address synchronous circuit of claim 1, wherein the operation mode signals of the semiconductor memory include a chip select signal (CSB), a RAS signal (RASB), a CAS signal (CASB) and a write enable signal (WEB).

4. The address synchronous circuit of claim 3, further comprising:
   an address input buffer unit configured to buffer an address; and
   a setup hold delay unit configured to delay the buffered address output from the address input buffer unit, wherein the chip select signal, the RAS signal, the CAS signal and the write enable signal output from the setup hold delay unit via the address input buffer unit.

5. The address synchronous circuit of claim 3, wherein the address control signal generating unit outputs the control signal of a low level when the chip select signal is inactivated or when the RAS signal, the CAS signal and the write enable signal are all inactivated.

6. The address synchronous circuit of claim 3, wherein the address control signal generating unit outputs the control signal in synchronization with the internal clock signal when the chip select signal, the RAS signal, the CAS signal and the write enable signal are all activated.

7. The address synchronous circuit of claim 1, wherein the address control signal generating unit includes:
   a first logic unit for performing a first logic operation in response to the operation mode signals of the semiconductor memory;
   a latch unit for latching an output signal of the first logic unit in response to the internal clock signal; and
   a second logic unit for performing a second logic operation in response to the output signal of the latch unit and the internal clock signal.

8. The address synchronous circuit of claim 1, wherein the address synchronous unit includes:
   a cross-coupled latch unit for latching an input address which is input in response to the control signal; and
   a driving unit for pull-up or pull-down driving in response to an output signal of the cross-coupled latch unit.

9. An address synchronous circuit comprising:
   an address input buffer unit configured to output an address signal in response to a clock enable signal;
   a setup hold delay unit for delaying the address signal output by the address input buffer unit and outputting the delayed address signal;
   an address control signal generating unit for generating a control signal in response to operation mode signals of a semiconductor memory and an internal clock signal; and
   an address synchronous unit for controlling the output of the delayed address signal from the setup hold delay unit, in response to the control signal.

10. The address synchronous circuit of claim 9, wherein the operation mode signals of the semiconductor memory include a chip select signal, a RAS signal, a CAS signal and a write enable signal.

11. The address synchronous circuit of claim 10, wherein the chip select signal, the RAS signal, the CAS signal and the write enable signal are output from the setup hold delay unit via the address input buffer unit.

12. The address synchronous circuit of claim 10, wherein the address control signal generating unit outputs the control signal of a low level when the chip select signal is inactivated or when the RAS signal, the CAS signal and the write enable signal are all inactivated.

13. The address synchronous circuit of claim 10, wherein the address control signal generating unit outputs the control signal in synchronization with the internal clock signal when the chip select signal, the RAS signal, the CAS signal and the write enable signal are all activated.

14. The address synchronous circuit of claim 9, wherein the address control signal generating unit includes:
   a first logic unit for performing a first logic operation in response to the operation mode signals of the semiconductor memory;
   a latch unit for latching an output signal of the first logic unit in response to the internal clock signal; and
   a second logic unit for performing a second logic operation in response to the output signal of the latch unit and the internal clock signal.

15. The address synchronous circuit of claim 9, wherein the address synchronous unit includes:
   a cross-coupled latch unit for latching the delayed address signal which is input, in response to the control signal; and
   a driving unit for pull-up or pull-down driving in response to an output signal of the cross-coupled latch unit.

* * * * *